US 6,566,246 B1

(12) United States Patent
de Felipe et al.

(10) Patent No.: US 6,566,246 B1
(45) Date of Patent: May 20, 2003

(54) DEPOSITION OF CONFORMAL COPPER SEED LAYERS BY CONTROL OF BARRIER LAYER MORPHOLOGY

(75) Inventors: Tarek Suwwan de Felipe, Mountain View, CA (US); Michal Danek, Cupertino, CA (US); Erich Klawuhn, San Jose, CA (US); Alexander Dulkin, Sunnyvale, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/862,539

(22) Filed: May 21, 2001

(51) Int. Cl.[7] .......................................... H01L 21/4763
(52) U.S. Cl. ...................................... 438/627; 438/687
(58) Field of Search .................................. 438/627, 643, 438/653, 680, 681, 687, 700, 706

(56) References Cited

U.S. PATENT DOCUMENTS 4,609,903 A * 9/1986 Toyokura et al. ............ 252/512
5,139,825 A * 8/1992 Gordon et al. .............. 423/411
6,333,547 B1 * 12/2001 Tanaka et al. ............... 257/649
6,342,448 B1 * 1/2002 Lin et al. ..................... 438/687

OTHER PUBLICATIONS

Schumacher Products, *TDEAT (Tetrakis–diethylamino Titanium), Electronic Grade,* www.schumacher.com/tdeat.html, printed Jun. 5, 2001, 1 page.

* cited by examiner

Primary Examiner—David Nelms
Assistant Examiner—David Nhu
(74) Attorney, Agent, or Firm—Beyer Weaver & Thomas, LLP

(57) ABSTRACT

The present invention pertains to systems and methods for improving the deposition of conformal copper seed layers in integrated circuit metalization. The invention involves controlling the morphology of the barrier layer deposited underneath the copper seed layer. The barrier layer can be composed of TaN and Ta, or TaN alone. It can also be composed of TiN or TiNSi. The process conditions of the barrier layer deposition are carried out in a manner that results in a highly or completely amorphous crystalline structure. Such a barrier layer allows for conformal deposition of the copper seed layer on top of the barrier layer that is less susceptible to agglomeration.

63 Claims, 15 Drawing Sheets

DEPOSITION OF CONFORMAL COPPER SEED LAYERS BY CONTROL OF BARRIER LAYER MORPHOLOGY

CROSS-REFERENCE TO RELATED APPLICATIONS

This patent application is related to U.S. patent application 09/776,702, "Anti-Agglomeration of Copper in Integrated Circuit Metalization" filed by Robzicki on Feb. 2, 2001 and U.S. patent application Ser. No. 09/776,704, "Passivation of Copper in Dual Damascene Metalization", filed by Rozbicki et al. on Feb. 2, 2001. These patent applications, along with all other patent applications, patents and publications mentioned herein are incorporated by reference in their entirety for all purposes.

FIELD OF THE INVENTION

The present invention pertains to systems and methods for improving the deposition of conformal copper seed layers in integrated circuit metalization. The invention involves controlling the morphology of the barrier layer deposited underneath the copper seed layer. The barrier layer can be composed of TaN and Ta, or TaN alone. It can also be composed of TiN or TiNSi. The process conditions of the barrier layer deposition are carried out in a manner that results in a highly or completely amorphous crystalline structure. Such a barrier layer allows for conformal deposition of the copper seed layer on top of the barrier layer that is less susceptible to agglomeration.

BACKGROUND OF THE INVENTION

Integrated circuit (IC) manufacturers have traditionally used aluminum and aluminum alloys, among other metals, as the conductive metal for integrated circuits. While copper has a greater conductivity than aluminum, it has not been used because of certain challenges it presents, including the fact that it readily diffuses into silicon oxide and degrades insulating electrical properties even at very low concentrations. Recently, however, IC manufacturers have been turning to copper because of its high conductivity and electromigration resistance, among other desirable properties. Most notable among the IC metalization processes that use copper is Damascene processing.

Damascene processing is a method for forming metal lines on integrated circuits. It involves formation of inlaid metal lines in trenches and vias formed in a dielectric layer (inter-metal dielectric). A barrier layer that blocks diffusion of copper atoms is formed over the dielectric layer topology. Damascene processing is often a preferred method because it requires fewer processing steps than other methods and offers a higher yield. It is also particularly well-suited to metals such as Cu that cannot readily be patterned by plasma etching.

In a typical copper IC process, the formation of the desired conductive wires on the chip generally begins with a seed layer, usually deposited by physical vapor deposition (PVD). The seed layer provides a conformal, conductive layer on which a thicker layer of copper is electrofilled in order to fill in the features (e.g., trenches and vias) of the semiconductor wafer. PVD has traditionally been used to form the seed layer, but does not always provide totally conformal step coverage, particularly with respect to surface features with high aspect ratios (greater than about 5:1), where aspect ratio refers to the ratio of the feature height to the feature width. Coverage that is not conformal means coverage that is uneven, i.e., thicker in some places than others, and that may include actual gaps where the metal is discontinuous, all of which are highly undesirable in IC manufacturing. Modern integrated circuit manufacturing has moved toward features with these high-aspect ratios, particularly in advanced integrated circuits where copper is used at the conductive metal, e.g., Damascene processing. For instance, a typical via may have a diameter of 0.07 $\mu$m (the width of 266 copper atoms) but have a depth of 0.4 $\mu$m, which is an aspect ratio of 5.7:1.

A major and unresolved problem of copper metalization is the inability to guarantee conformal deposition of the copper. For instance, the copper tends to agglomerate. It also tends to form notches at the top of surface features. Notching is a phenomenon that occurs at the top edge of a feature, wherein the changing crystalline orientation interferes with conformal deposition, so that a thinly deposited or even void region develops at the top of the feature.

Typically, an integrated circuit substrate is coated with a barrier layer that blocks diffusion of copper atoms. It is typically formed over the dielectric layer and prior to deposition of copper. The problems of agglomeration and notching of the copper are in large part due to how the copper interacts with this barrier layer. What is therefore needed is a way to form the barrier layer that reduces or eliminates agglomeration and notching of the copper.

SUMMARY OF THE INVENTION

The present invention pertains to systems and methods for improving the deposition of conformal copper seed layers in integrated circuit metalization. The invention involves controlling the morphology of the barrier layer deposited underneath the copper seed layer. The barrier layer can be composed of TaN and Ta, or TaN alone. It can also be composed of TiN or TiNSi. The process conditions of the barrier layer deposition are carried out in a manner that results in a highly or completely amorphous crystalline structure. Such a barrier layer allows for conformal deposition of the copper seed layer on top of the barrier layer that is less susceptible to agglomeration.

One aspect of the present invention provides a method for forming a barrier layer comprising tantalum nitride by physical vapor deposition on a semiconductor substrate, such that the barrier layer reduces agglomeration and notching of a copper seed layer formed on top of the barrier layer. The method includes sputtering a target comprising tantalum and introducing a nitrogen source in an amount so that the surface of the barrier layer displays a randomness greater than about 50%. The nitrogen source is typically $N_2$ gas, flowed at about 10 to 110 SCCM. The method may be carried out at 2 to 8 millitorr and about 20 to 80° C. The barrier layer may be deposited at about 1 to 15 Å per second. The barrier layer may be deposited to a thickness of about 25 to 100 Å as measured at the bottom of a feature on the semiconductor substrate.

Randomness in a sample can be seen in an X-ray diffraction (XRD) plot. Samples with completely-ordered crystalline structures (0% random) ideally have XRD peaks that have a maximal intensity and zero width, though in reality peaks that represent highly-ordered structures are not perfectly sharp, but merely very sharp and narrow. A purely random sample (100% random) has no discernable peaks. Randomness is typically quantified as a percentage number determined from another plot known as an XRD Rocking curve.

Another aspect of the present invention provides a method for forming a barrier layer comprising tantalum and tantalum nitride by physical vapor deposition on a semiconductor substrate, such that the barrier layer reduces agglomeration and notching of a copper seed layer formed on top of the barrier layer. The method includes sputtering a target comprising tantalum, and sputtering a target comprising tantalum while introducing a nitrogen source to deposit tantalum nitride at the surface of the barrier layer in an amount so that the surface of the barrier layer displays a randomness greater than about 50%. The nitrogen source is typically $N_2$ gas, flowed at about 10 to 110 SCCM. The method may be carried out at 2 to 8 millitorr and about 20 to 80° C. The barrier layer may be deposited at about 1 to 15 Å per second. The tantalum nitride layer may be deposited to a thickness of about 25 to 100 Å as measured at the bottom of a feature on the semiconductor substrate. The tantalum layer may be deposited to a thickness of about 25 to 150 Å.

Another aspect of the present invention provides a method for forming a barrier layer comprising tantalum and tantalum nitride by physical vapor deposition on a semiconductor substrate, such that the barrier layer reduces agglomeration and notching of a copper seed layer formed on top of the barrier layer. The method includes sputtering a target comprising tantalum while introducing a nitrogen source to deposit tantalum nitride as a bottom layer, sputtering a target comprising tantalum, and sputtering a target comprising tantalum to deposit a tantalum middle layer, and sputtering a target comprising tantalum while introducing a nitrogen source to deposit tantalum nitride as a top layer at the surface of the barrier layer in an amount so that the surface of the barrier layer displays a randomness greater than about 50%. The nitrogen source is typically $N_2$ gas. The method may be carried out at 2 to 8 millitorr and about 20 to 80° C. The barrier layer may be deposited at about 1 to 15 Å per second. Both tantalum nitride layers may be deposited to a thickness of about 25 to 100 Å as measured at the bottom of a feature on the semiconductor substrate. The tantalum layer may be deposited to a thickness of about 25 to 150 Å.

Another aspect of the present invention provides a method for forming a barrier layer comprising titanium nitride by chemical vapor deposition on a semiconductor substrate, such that the barrier layer reduces agglomeration and notching of a copper seed layer formed on top of the barrier layer. The method includes introducing a titanium-containing precursor and a nitrogen source into a chamber, the nitrogen source being introduced in an amount so that the surface displays a randomness of at least about 50%.

The titanium-containing precursor may be TDEAT. The nitrogen source may be $NH_3$. The method may be carried out at about 25 to 100 torr. The method of claim 45 wherein the method may be carried out at about 200 to 500° C. The $NH_3$ flow may be about 3 to 8 liters gas per minute. The TDEAT flow may be about 0.02 to 0.20 mg liquid per minute. The barrier layer may be deposited at about 1 to 15 Å per second. Both tantalum nitride layers may be deposited to a thickness of about 25 to 100 Å as measured at the bottom of a feature on the semiconductor substrate.

Another aspect of the invention provides for an apparatus module for physical vapor deposition of a barrier layer comprising tantalum nitride in a manner that the surface of the barrier layer displays a randomness greater than about 50%. The apparatus includes a physical deposition chamber, a tantalum target, a source of neutral sputtering gas and a nitrogen source. The nitrogen source is typically $N_2$ gas. The apparatus may have a substrate having a dielectric patterned for Damascene processing.

Another aspect of the invention provides for an apparatus module for chemical vapor deposition of a barrier layer comprising tantalum nitride in a manner that the surface of the barrier layer displays a randomness greater than about 50%. The apparatus includes a chemical deposition chamber, a source of a titanium-containing precursor and a nitrogen source. The nitrogen source can be $NH_3$. The apparatus may have a substrate having a dielectric patterned for Damascene processing. The titanium-containing precursor may be TDEAT.

Another aspect of the invention provides for a partially fabricated integrated circuit comprising a via or trench and a barrier layer lining the via or trench and including tantalum nitride, wherein the barrier layer displays a randomness of at least about 50%. The barrier layer reduces agglomeration and notching of a copper seed layer deposited on the barrier layer. The barrier layer may be 25 to 100 Å thick at the bottom of a feature of the semiconductor substrate. The barrier layer may further comprises at least one layer of tantalum.

Another aspect of the invention provides for a partially fabricated integrated circuit comprising a via or trench and a barrier layer lining the via or trench and including titanium nitride, wherein the barrier layer displays a randomness of at least about 50%. The barrier layer reduces agglomeration and notching of a copper seed layer deposited on the barrier layer. The barrier layer may be 25 to 100 Å thick at the bottom of a feature of the semiconductor substrate.

These and other features and advantages of the present invention will be described in more detail below with reference to the associated drawings.

DETAILED DESCRIPTION OF THE PREFERRED EMBODIMENTS

In the following detailed description of the present invention, numerous specific embodiments are set forth in order to provide a thorough understanding of the invention. However, as will be apparent to those skilled in the art, the present invention may be practiced without these specific details or by using alternate elements or processes. In other instances well-known processes, procedures and components have not been described in detail so as not to unnecessarily obscure aspects of the present invention.

A "semiconductor wafer" as referred to in this invention is a semiconductor substrate at any of the various states of manufacture in the production of integrated circuits. One standard semiconductor wafer described in this invention is 200 mm in diameter, 0.75 mm thick, with an approximate radius of curvature of about 0.15 millimeters (see SEMI Specification M1-0298). Of course, semiconductor wafers of other dimensions, such as a standard 300 mm diameter silicon wafers, can also be processed in accordance with this invention. Note that standard specifications for a 300 mm diameter wafer may be found in SEMI Specification M1.15-0997.

A "substrate surface" as referred to in this invention is any surface whereupon a seed layer is to be deposited. Substrate surfaces include, but are not limited to, semiconductor substrate surfaces in various states of manufacture, including surfaces on which the barrier layer has just been deposited.

The current invention is compatible with any sort of semiconductor manufacturing where a thin "seed" layer of copper must be deposited. This seed layer is typically deposited in preparation for deposition of a thicker electrofill layer. A particular semiconductor process that is compatible with the invention is Damascene processing, including dual Damascene processing, but the current invention is not limited to Damascene processing or semiconductor processing in general. The current invention is useful in many applications where a thin layer or layers of metal must be deposited.

Figure 1:
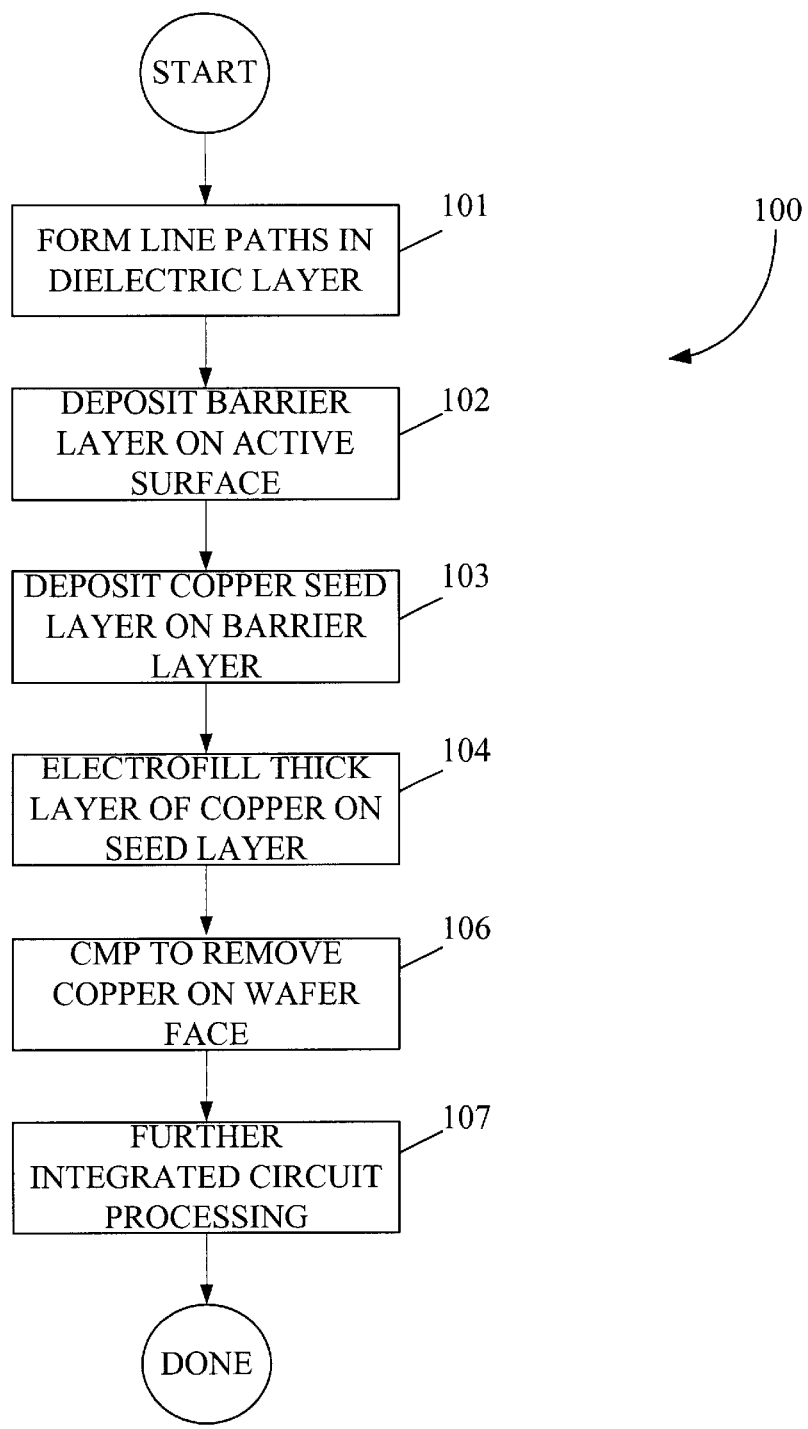
FIG. 1 is a process flow diagram illustrating relevant operations employed to form conductive copper lines by Damascene processing.

A typical Damascene process flow 100 is illustrated in the flowchart of FIG. 1 in order to contextualize the present invention. Process 100 begins with formation of line paths in a previously formed dielectric layer. These line paths may be etched as trenches and vias in a blanket layer of dielectric such as silicon dioxide. The line paths define conductive routes between various devices on a semiconductor wafer. Because copper or other mobile conductive material provides the conductive paths of the semiconductor wafer, the underlying dielectric layers must be protected from metal ions (e.g., $Cu^+$) that might otherwise diffuse into the silicon. To accomplish this, the process includes depositing a thin diffusion barrier layer 102 before depositing the metal. Suitable materials for the diffusion barrier layer include titanium, tantalum (Ta), tantalum nitride (TaN), tantalum nitride silicon (TaNSi), tungsten (W), titanium (Ti), titanium nitride (TiN), titanium nitride silicon (TiNSi) and the like. The barrier layer is typically formed by a PVD process such as sputtering or by a CVD process.

Before inlaying the line paths with the electrofill copper, a conductive surface coating must be applied. In the depicted process, this is accomplished by depositing a copper seed layer on the barrier layer at 103. This seed layer is deposited by a PVD process of the current invention, as will be discussed in detail below. Typically, the seed layer is deposited to a thickness of between about 600–2000 Å and more preferably between 800–1500 Å, as measured in the field of the semiconductor substrate. Next, as indicated at 104, a much thicker layer of copper is deposited on the seed layer by electroplating. After deposition of the copper is completed, the copper is planarized, generally by chemical-mechanical polishing (CMP) down to the dielectric at 106 in preparation for further processing (illustrated at 107), generally the addition of subsequent dielectric and metalization layers. Examples of these techniques are described in U.S. patent application Ser. No. 09/776,702 and U.S. patent application Ser. No. 09/776,704.

Figure 2:
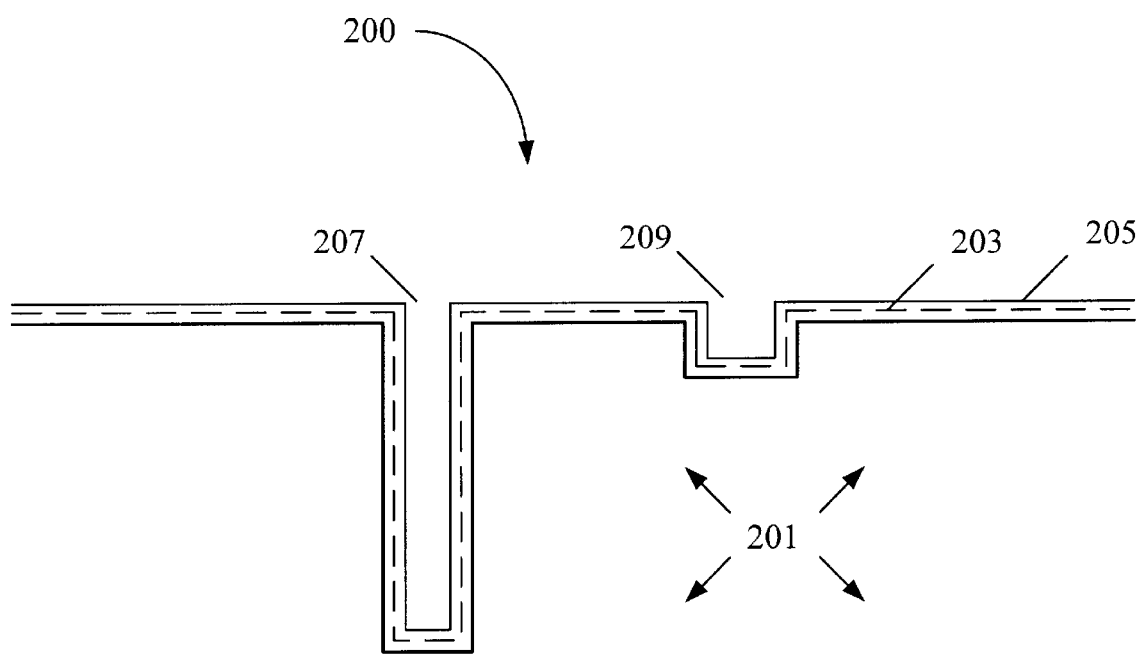
FIG. 2 is a schematic illustration showing a substrate surface with a deposited barrier layer and copper seed layer.

FIG. 2 schematically illustrates a section of an IC substrate 200, including the dielectric 201, barrier layer to be deposited in accordance with the present invention 203, and the seed layer of copper 205. The figure also shows two etched surface features for illustrative purposes, 207 and 209. The substrates may also have previously formed layers of barrier and metal (not shown).

When copper is deposited on a typical barrier surface in IC metalization such as tantalum or tantalum nitride, or even on the dielectric itself, it tends to agglomerate. The behavior of a film of metal or liquid on a surface is determined by the balance of surface forces at the interface. These forces are described by the Young-Dupré equation, which is further described in Zinke-Allmang, M., "Phase separation on solid surface: nucleation, coarsening and coalescence kinetics," Thin Solid Films 346 (1999) 1–68, and also in U.S. patent application Ser. No. 09/776,702.

Barrier Layer Deposition

Many techniques are known in the prior art for depositing Ta, TaN and TiN as barrier layers for IC metalization. However, these techniques result in regular crystal formation in the barrier layers, which causes agglomeration and notching of subsequent copper layers. While not wishing to be bound by theory, it is believed that ordered crystal structures result in agglomeration and notching because they reduce mobility of the copper atoms once they deposit on the barrier surface. If the surface of the barrier can be made relatively amorphous in its crystal structure, by contrast, the mobility of the copper would be effectively increased as the copper is freer to migrate in random directions. The terms amorphous and random are used interchangeably and will be discussed in more detail below in the context of X-ray diffraction.

Figure 3:
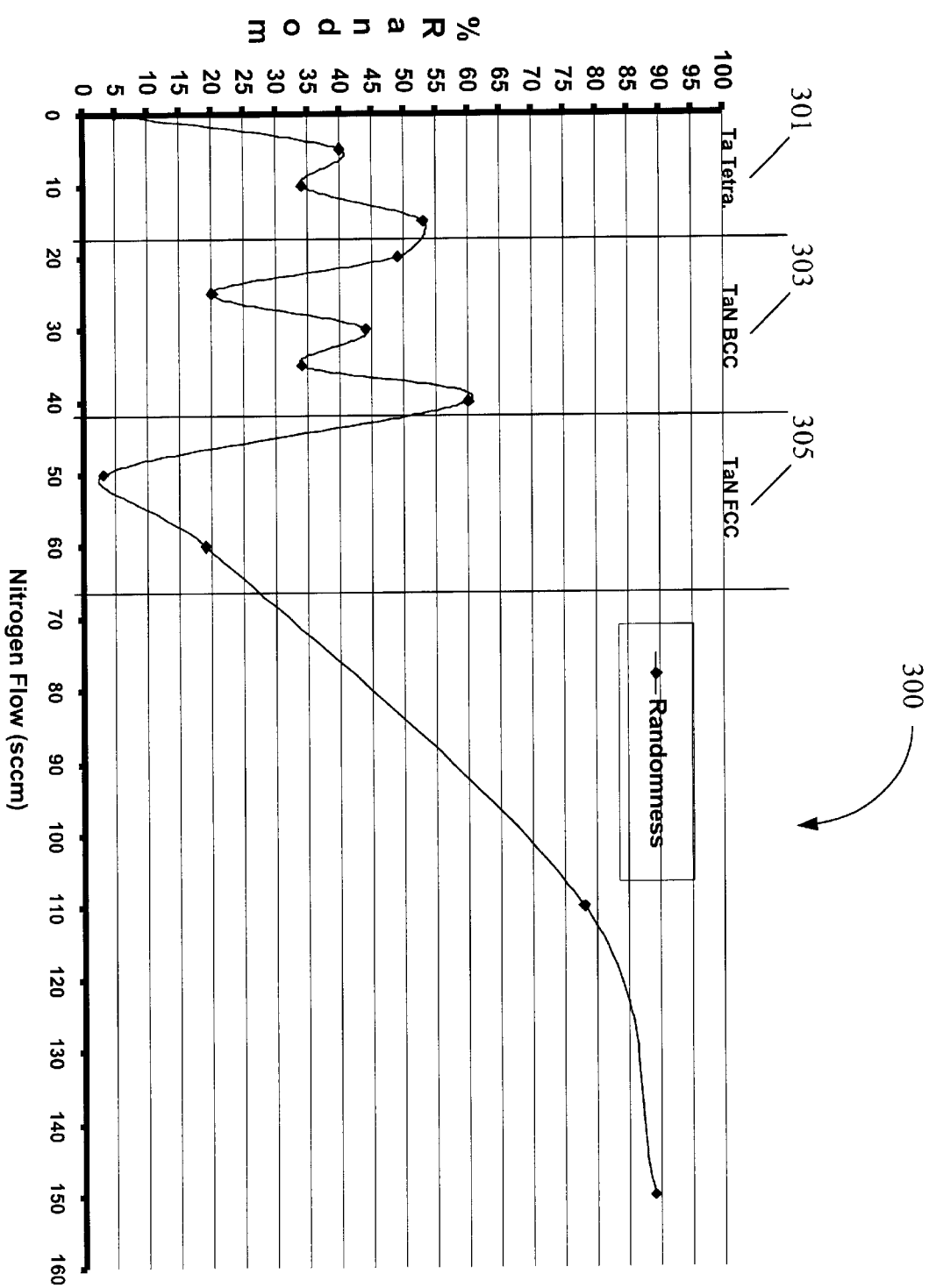
FIG. 3 is a graph describing the different Ta and TaN crystal orientations that are formed, along with the percentage randomness of the structures formed at different $N_2$ flow rates.

Pure Ta that is sputtered by PVD tends to form in a regular Hexagonal Close Pack (HCP) crystalline arrangement. Such a regular arrangement reduces copper mobility and thus can result in severe agglomeration and notching. However, according to present invention, if nitrogen, even in small amounts, is introduced while the Ta is sputtered, the nitrogen atoms insert themselves within into the crystal matrix. FIG. 3 is graph 300, that illustrates the effect of different nitrogen flows on Ta and TaN crystal formation. In this graph, the Ta was sputtered with a constant 108 SCCM Ar flow rate using the PVD method and apparatus described below. Even at 5 SCCM $N_2$, considerable randomness is introduced into the Ta crystal. At about 18 SCCM $N_2$, a TaN Body Centered Cubic (BCC) arrangement, with a fair amount of randomness, is formed instead of Ta. At about 42 SCCM $N_2$, a TaN Face Centered Cubic (FCC) arrangement is formed, with varying degrees of randomness. At about 50 SCCM the randomness begins to increase into a regime where there is no predominant crystal arrangement, e.g., almost 80% random at 108 SCCM $N_2$. The predominant crystal regimes are illustrated on the graph as Ta HCP 301, TaN BCC 303 and Ta FCC 305.

Techniques of the prior art describe process conditions that result in both of these undesirable, highly-ordered crystalline structures. The current invention, by contrast, discloses techniques that result in far more amorphous or even completely random crystalline structures. Typically, to achieve the most conformal deposition of the copper, a highly-random barrier layer surface is desirable. However, it has been found that highly-random TaN depositions can result in barrier layers with undesirable material properties, for example, high resistivities and/or poor electrofill of the copper plug. Therefore, in some cases the preferred embodiments disclose nitrogen levels that result in a barrier layer that is only partially random, as a compromise between the consideration of good material properties and randomness. A randomness of about 50 to 70%, for example, is preferred percentage for forming a barrier layer that has both conformal copper coverage and good material properties.

Figure 4A:
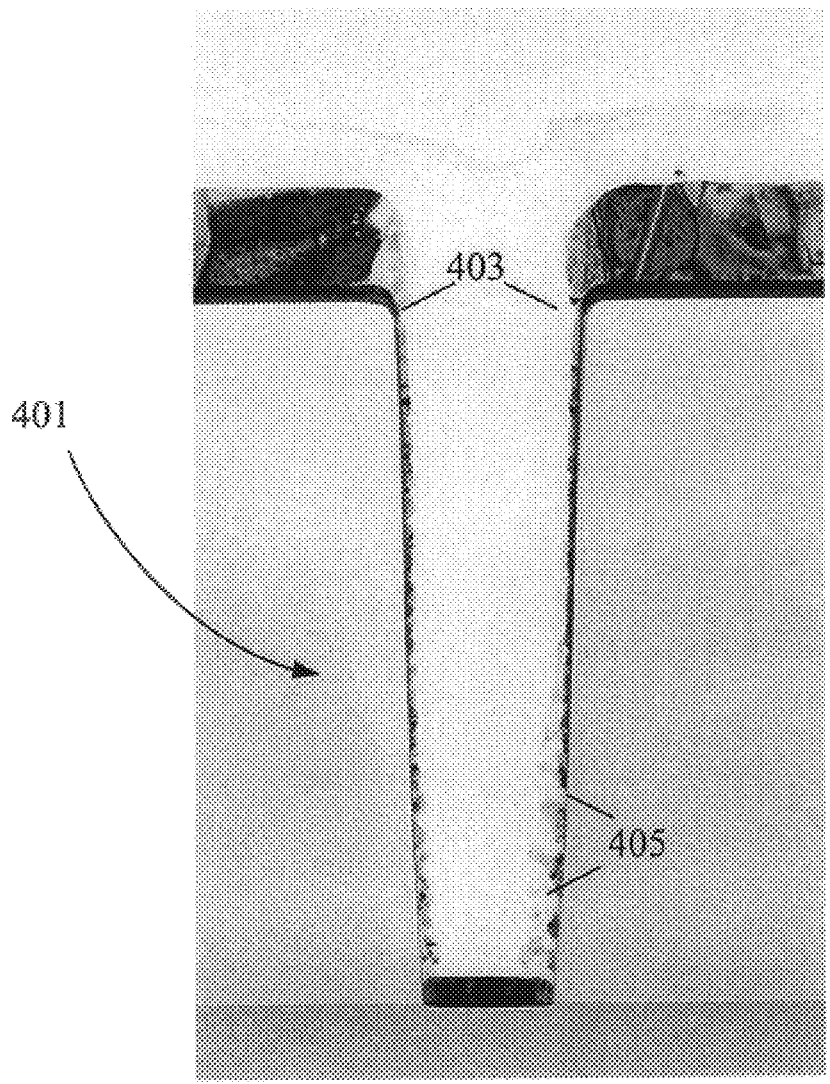
FIGS. 4A–4C are transmission electron micrographs (TEM) that illustrate undesirable notching and agglomeration of the copper seed layer on a surface feature.
Figure 4B:
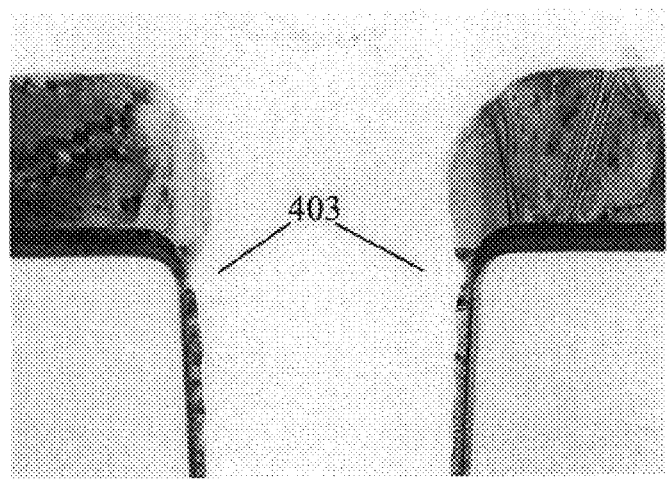
Figure 4C:
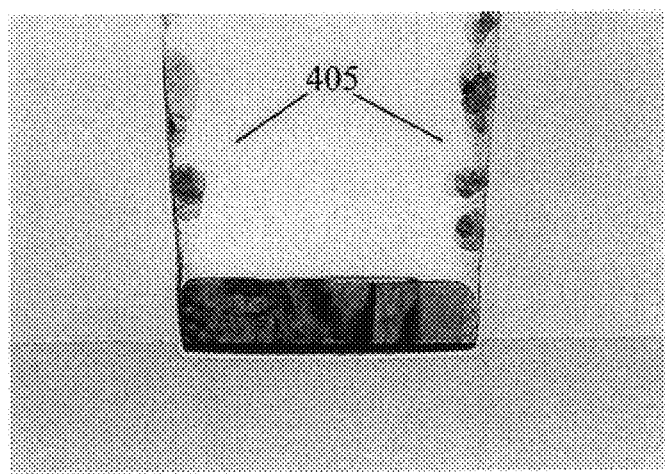
Figure 5A:
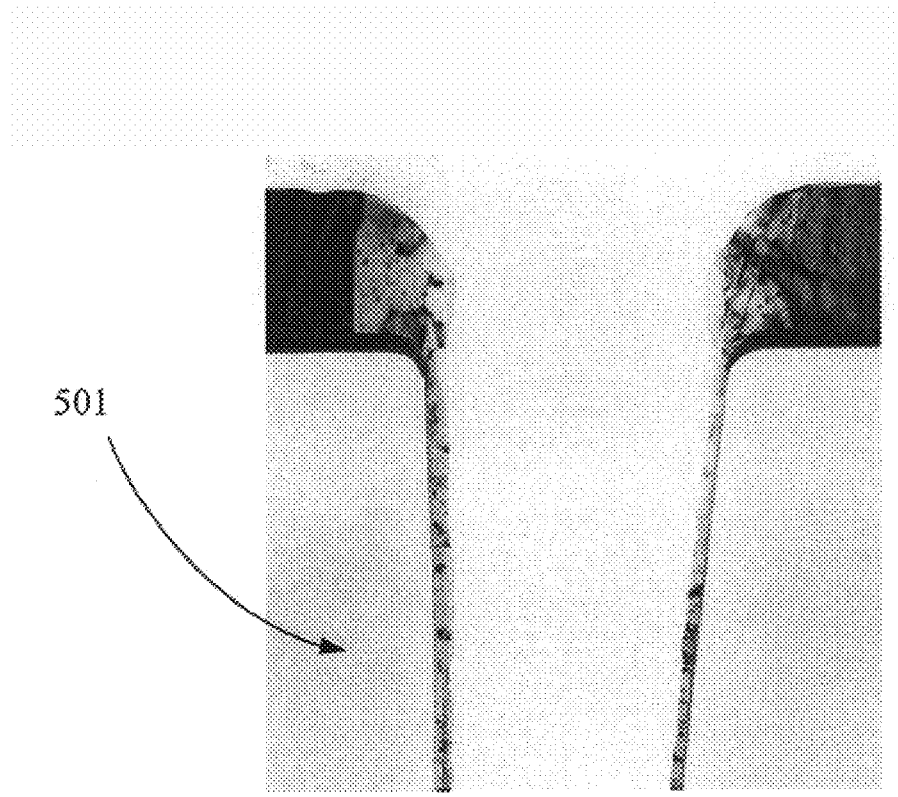
FIGS. 5A–5C are transmission electron micrographs (TEM) that illustrate a surface feature with a barrier layer deposited in accordance with the current invention. The copper seed layer subsequently forms without notching or agglomeration.
Figure 5B:
Figure 5C:
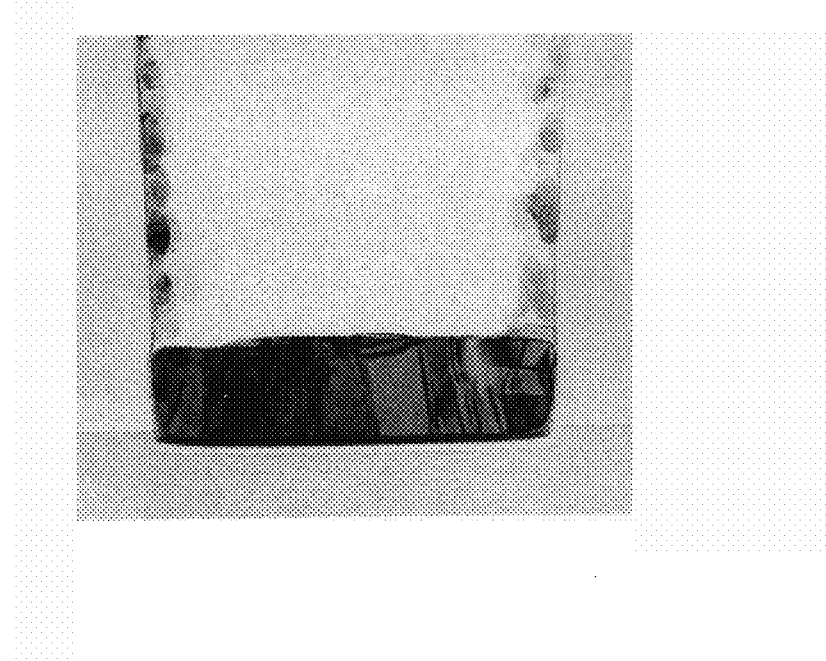

FIGS. 4A–4C are transmission electron micrographs of a surface feature, that displays typical agglomeration and notching of the copper seed layer. In FIG. 4A, the entire surface feature, 401, can be seen with undesirable notching 403 and agglomeration, 405. FIG. 4B is a close=up of the top of the feature that magnifies the notches 403. FIG. 4C is a close-up of the bottom of the feature that magnifies some of the agglomeration 405. Note that agglomeration and notching can also occur to some degree with the morphology of the barrier layer itself. FIGS. 5A–5B show a similar surface feature deposited with a barrier layer of the current invention, in this case, a random TaN layer deposited by PVD with an Ar flow of 108 SCCM and $N_2$ flow of 150 SCCM. In FIG. 5A, as well as the close-up FIGS. 5B and 5C, the surface feature, 501, can be seen with no discernable notching or agglomeration.

FIGS. 6A–6D are flowcharts that describe the barrier deposition of the current invention in various embodiments. FIGS. 7A–7D are schematic illustrations of the barrier layers corresponding to those embodiments, respectively. The barrier deposition operations described in these figures can be subsumed under operation 102 described in the high-level description of Damascene metalization.

Figure 6A:
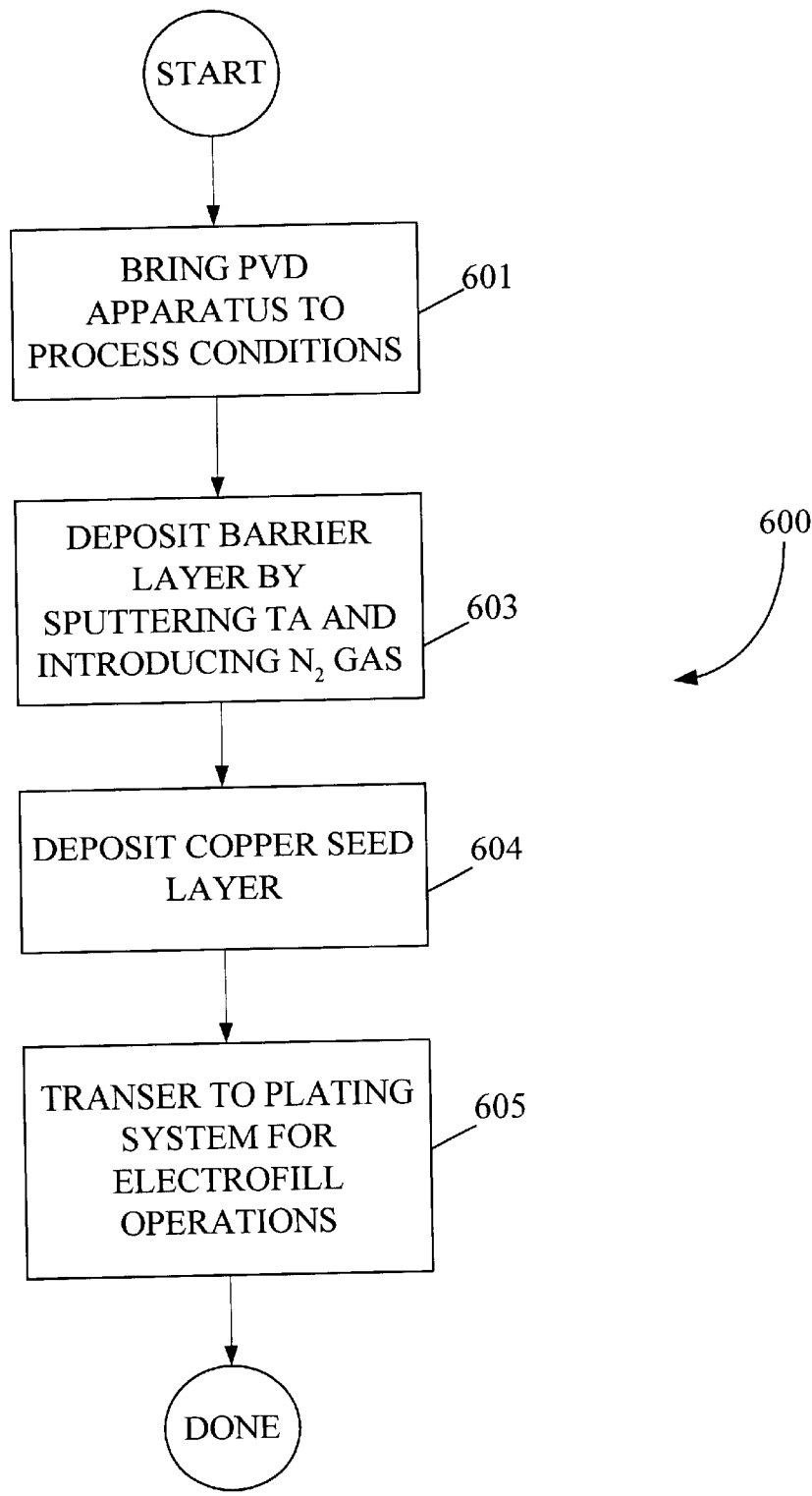
FIGS. 6A–6C are process flow diagrams that illustrate various preferred embodiments for depositing a relatively random barrier layer by PVD processes.
Figure 6B:
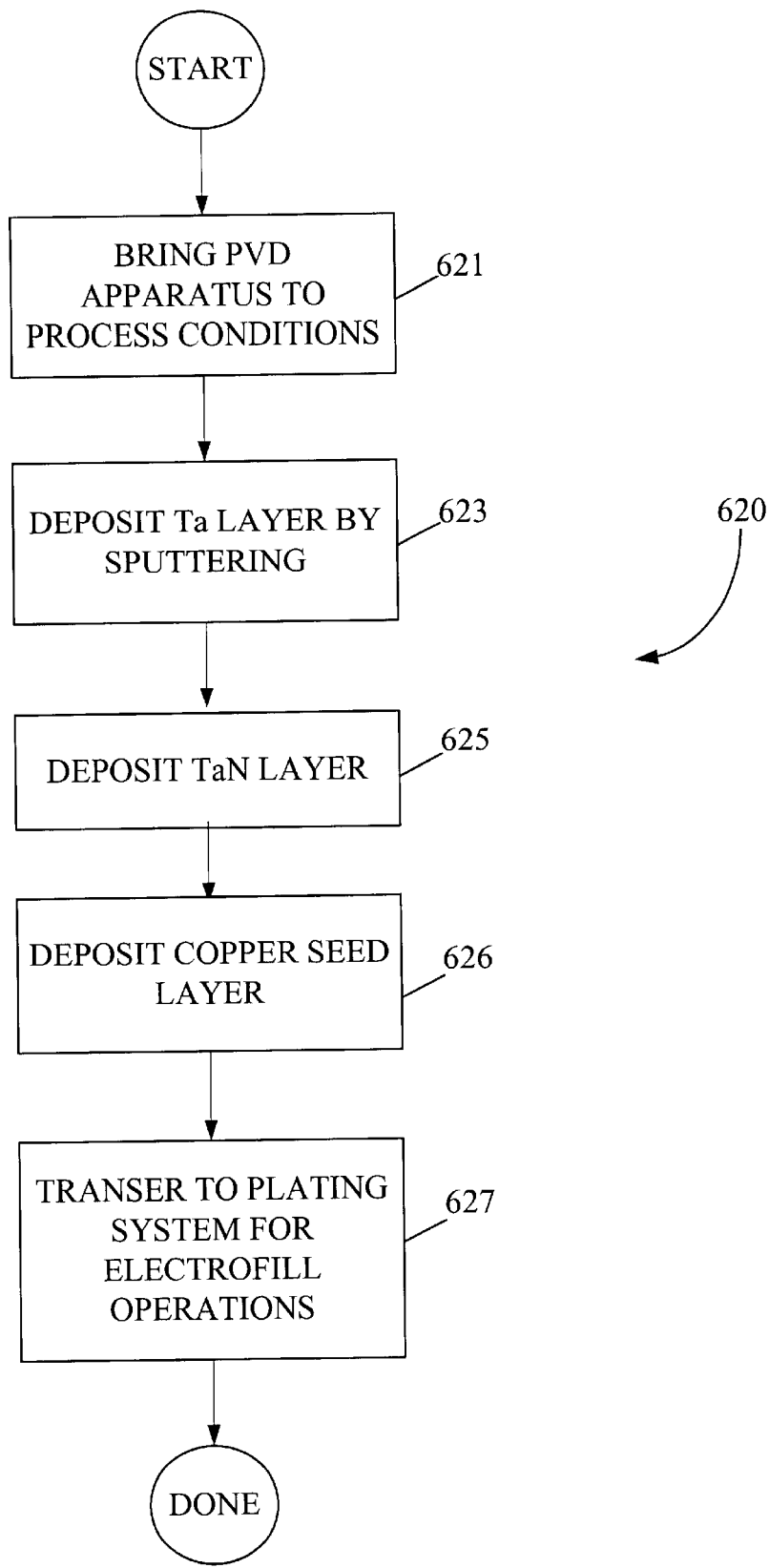

In one preferred embodiment, described in FIG. 6A, the entire barrier layer is composed of TaN, which is typically deposited by (PVD). Hollow cathode magnetron (HCM) PVD is a preferred method for carrying out the PVD in this embodiment and the embodiments described below. HCM PVD uses a hollow metal cathode (target) rather than the flat target that is used in most PVD methods and a DC magnet coil instead of an RF magnet coil. In some cases, HCM PVD is preferable to other PVD methods because it achieves up to about 90% ionization, rather than the mere 2% that is typical of other methods. Because of this ionization ratio, among other reasons, HCM provides more conformal coverage of the substrate surface. One example of an apparatus suitable for HCM PVD is the INOVA, available from Novellus Systems of San Jose, Calif.

As described in the process 600 of FIG. 6A, the PVD apparatus is first brought to process conditions. See 601. The process is typically carried out at 2 to 8 millitorr and 20 to 80° C. A tantalum target is sputtered with a neutral plasma, typically argon, in order to deposit tantalum ions on the semiconductor surface. See 603. The argon flow rate is typically about 60 to 130 standard cubic centimeters (SCCM), more preferably about 108 SCCM. At the same time, a nitrogen-containing gas, preferably $N_2$, is introduced into the chamber. At an argon flow rate of 108 SCCM, the $N_2$ will preferably be flowed at about 10 to 110 SCCM and more preferably about 30 to 40 SCCM. The simultaneous sputtering of the target while introducing nitrogen results in the deposition of a TaN layer.

Figure 7A:
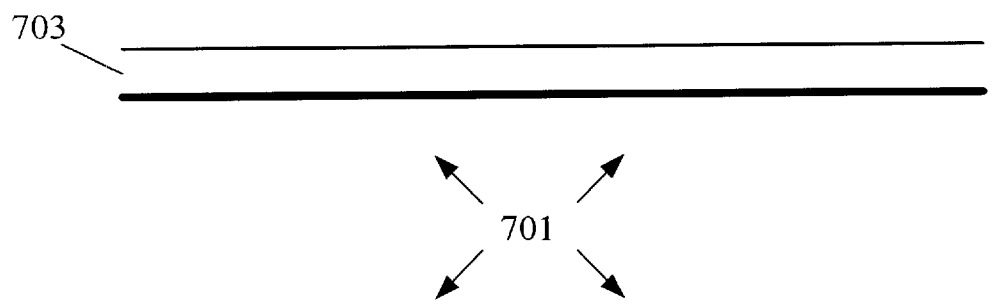
FIGS. 7A–7C are schematic illustrations of the barrier layers deposited by various preferred embodiments of the present invention, and correspond to the processes of FIG. 6A–6C, respectively.

After deposition of the TaN barrier layer, the copper seed layer is deposited. See 604. Next, the semiconductor wafer is moved to a plating system for subsequent electrofill operations in accordance with the IC manufacturing process being implemented, such as the Damascene processing described in FIG. 1. See 605. A schematic illustration of this single-layer TaN barrier is shown in FIG. 7A. The illustration includes the underlying dielectric 701 and the TaN layer 703. At an Ar flow rate of 108 SCCM and an $N_2$ flow rate of 10 to 110 SCCM, about 1 to 15 Å per second of barrier is formed. Preferably about 25 to 100 Å and most preferably about 50 Å of barrier is formed. Unless stated otherwise, the cited deposition thickness applies to the bottom of features on the semiconductor substrate, and not the field, which will be deposited with a somewhat thicker amount.

Because TaN has a high resistivity compared with Ta, alternative embodiments have been developed that can reduce the amount of TaN used the barrier layer. In these embodiments, much of the TaN is replaced with Ta. The embodiment described in FIG. 4B describes a method for depositing Ta and then depositing a thin layer of TaN on top of the Ta. The underlying Ta provides desirable thickness to the barrier layer with low resistivity. The thin layer of TaN at the top of the barrier layer provides the necessary amorphous surface to result in conformal copper coverage. As described in the process 620 of FIG. 6B, the PVD apparatus is first brought to process conditions. See 621. A tantalum target is sputtered with a neutral plasma, typically argon, in order to deposit tantalum ions on the semiconductor surface, in this case to form a pure Ta layer. See 623. The Ta deposition is carried out with 60 to 130 SCCM of argon, more preferably 108 SCCM. Preferably about 25 to 150 Å, more preferably about 100 Å of Ta is formed.

Next the TaN layer is formed by simultaneous sputtering of the Ta target with argon the introduction of a nitrogen-containing gas. See 625. The nitrogen-containing gas is typically $N_2$ gas. This deposition is carried out with 60 to 130 SCCM of argon, more preferably 108 SCCM. The $N_2$ will preferably be flowed at about 10 to 110 SCCM and more preferably about 30 SCCM. About 25 to 100 Å, more preferably about 50 Å, is TaN formed. In other embodiments, the deposition time is reduced so that about 50 Å of Ta is formed and about 10 Å of TaN is formed, thus reducing the resistivity of the barrier layer considerably in comparison with the embodiment described in FIG. 6A. At an Ar flow rate of 108 SCCM and an $N_2$ flow rate of 10 to 110 SCCM, about 1 to 15 Å per second of barrier is formed.

Figure 7B:
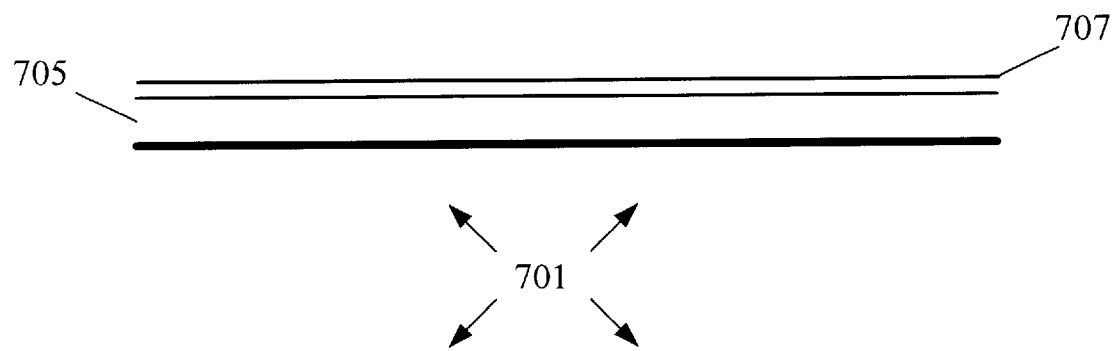

After deposition of the TaN barrier layer, the copper seed layer is deposited. See 626. Next, the semiconductor wafer is moved to a plating system for subsequent electrofill operations in accordance with the IC manufacturing process being implemented, such as the Damascene processing described in FIG. 1. See 627. A schematic illustration of these two layers is shown in FIG. 7B. The illustration includes the underlying dielectric 701 and the barrier, which is made up of a Ta layer 705 and a TaN layer 707.

Figure 6C:
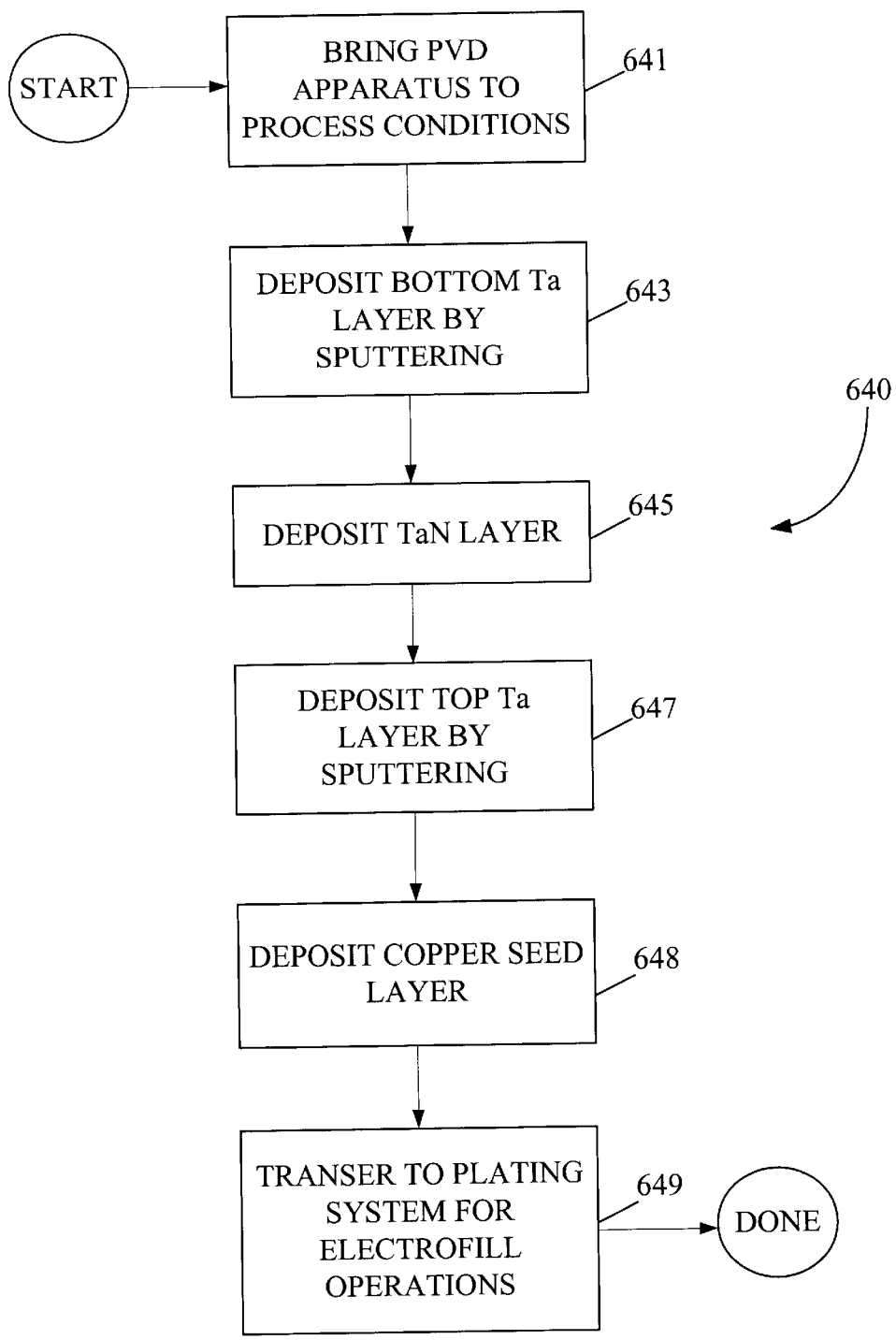

Yet another embodiment, described in FIG. 6C, takes advantage of the fact the Ta can be induced to have the desired random surface that improves copper deposition by creating a thin TaN layer underneath it. The TaN layer is deposited so that is has a relatively random structure, as described in the above embodiments. This TaN layer will induce a Ta layer deposited over it to have a similar crystalline structure. In this embodiment, a three-layer stack of Ta, TaN and Ta is typically deposited. The two Ta layers provide the necessary barrier protection at low resistivities. The middle TaN layer is deposited in an amorphous manner, so that it induces an amorphous crystalline structure in the Ta layer above it.

As described in the process 640 of FIG. 6C, the PVD apparatus is first brought to process conditions. See 641. In operation 643, the first Ta layer is deposited by sputtering with argon. This operation is carried out with 60 to 130 SCCM of argon, more preferably 108 SCCM. About 25 to 100 Å, more preferably about 50 Å of Ta is formed. Next, the amorphous TaN layer is deposited in much the same manner as described in the above embodiments using Ta sputtered with argon gas, along with the introduction of a nitrogen-containing gas. See 645. The nitrogen-containing gas is typically $N_2$. This is carried out with 60 to 130 SCCM of argon, more preferably 108 SCCM. The $N_2$ will preferably be flowed at about 10 to 110 SCCM and more preferably about 30 SCCM. About 25–100 Å, more preferably about 50 Å, of TaN is formed.

The top-most Ta layer is deposited with the same process conditions and parameters as the first Ta layer, to a thickness of about 25–150 Å, more preferably about 100 Å. See 647. The Ta is induced to have a crystal structure that resembles the TaN layer underneath it by that TaN layer. In other embodiments, the deposition time is reduced so that the bottom Ta layer is about 50 Å, the middle TaN layer is about 10 Å, and the top Ta layer is about 50 Å, thus reducing the resistivity of the barrier layer considerably in comparison with the embodiment described in FIG. 6A. At an Ar flow rate of 108 SCCM and an $N_2$ flow rate of 10 to 110 SCCM, about 1 to 15 Å per second of Ta is formed.

Figure 7C:
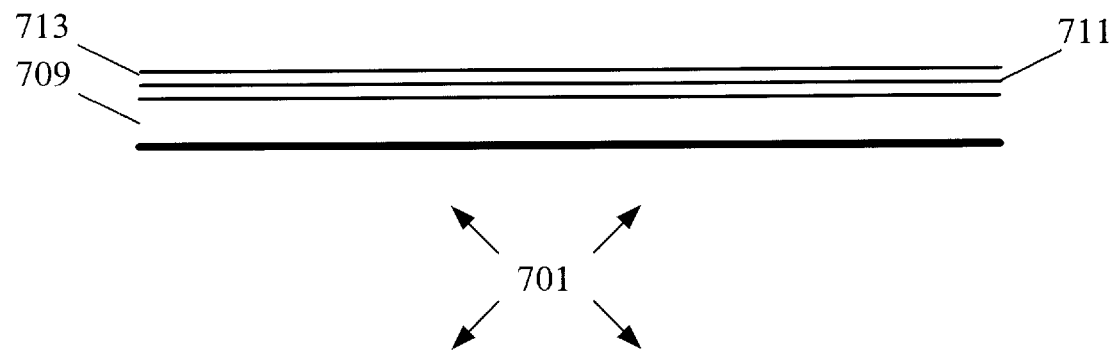

After deposition of the TaN barrier layer, the copper seed layer is deposited. See 648. Next, the semiconductor wafer is moved to a plating system for subsequent electrofill operations in accordance with the IC manufacturing process being implemented, such as the Damascene processing described in FIG. 1. See 649. A schematic illustration of these two layers is shown in FIG. 7C. The illustration includes the underlying dielectric 701 and the barrier, which is made up of a lower Ta layer 709, a middle TaN layer 711 and an upper Ta layer 713.

All three of these embodiments, as described, have been found to work well with IC features about 0.16 to 0.25 μm in size. Another embodiment, described in FIG. 8A involves the deposition of TiN by chemical vapor deposition CVD. The goal is much the same as in the other embodiments- to form a barrier layer with an amorphous crystalline structure, for example a random, microcrystalline or small-grained crystalline structure. A titanium-containing precursor, preferably TDEAT, available from Schumacher, Inc. of San Diego, Calif., is used to supply the Ti, typically $NH_3$ gas, is used to supply the nitrogen. The molecular structure of TDEAT is illustrated in FIG. 8C.

Figure 8A:
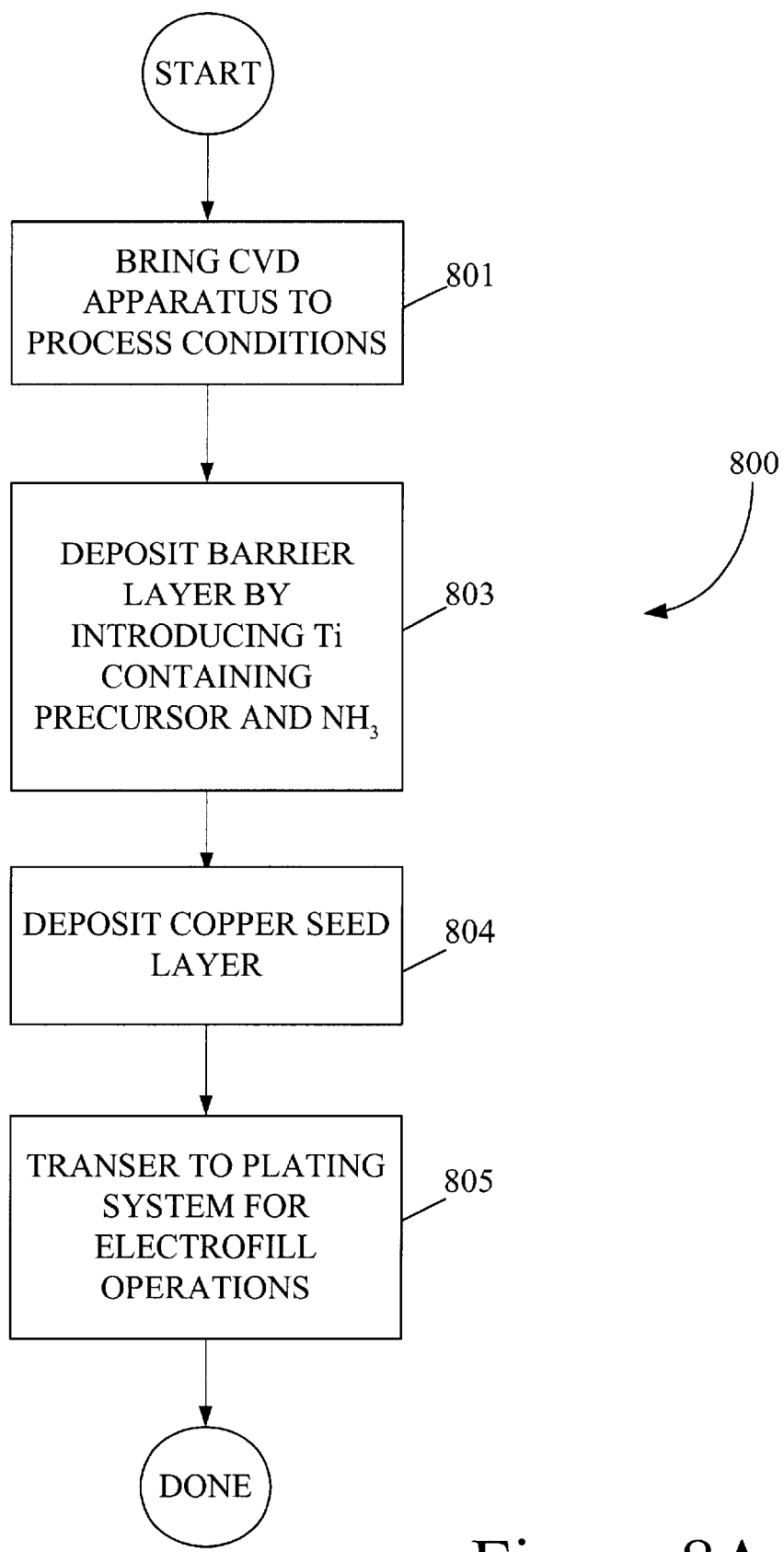
FIG. 8A is a process flow diagram that illustrates a preferred embodiment for depositing a random barrier layer by titanium CVD processes.

A process flow for this embodiment is described in FIG. 8A. See 800. First, a chemical vapor deposition (CVD) chamber, which is described in more detail below, is brought to process conditions, typically about 200–500° C., more preferably about 340° C., and a low vacuum of about 25–100 torr, more preferably about 60 torr. See 801. Next, in operation 803, the TDEAT and NH3 are flowed into the chamber. The TDEAT is introduced at a flow rate of about 0.02 ml to 0.20 ml of liquid per minute, more preferably about 0.11 mg. The TDEAT instantly turns to vapor under the process conditions. At the same time, liquid $NH_3$ is introduced at a flow rate corresponding to about 3000 to 9000 SCCM gas, more preferably about 6000 SCCM. The deposition as described results in a deposition of about 1 to 10 Å per second. The TiN is deposited to a thickness of 25–100 Å, more preferably about 50 Å.

Figure 8B:
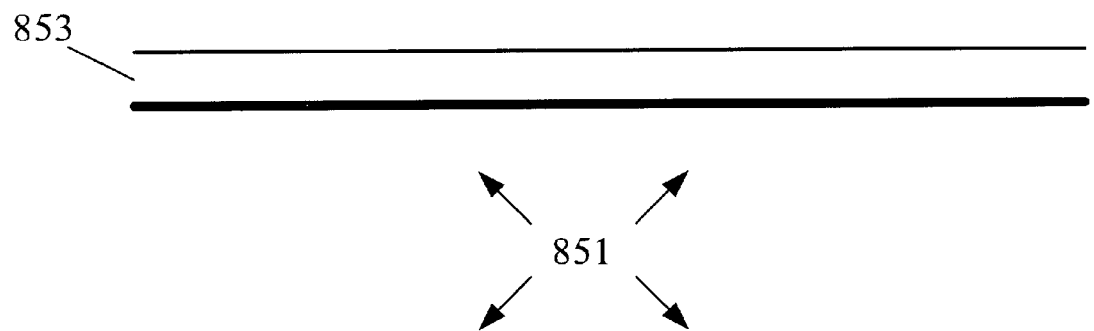
FIG. 8B is a schematic illustration of the barrier layers deposited by a preferred embodiment of the present invention, corresponding to the process of FIG. 6A.
Figure 8C:
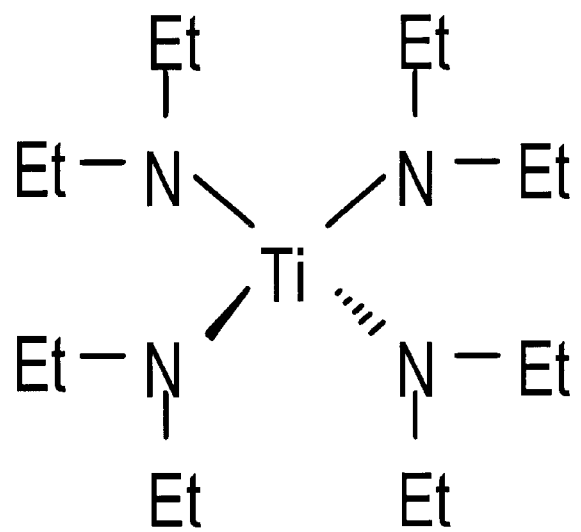
FIG. 8C illustrates the molecular structure of the titanium precursor TDEAT.

After deposition of the TiN barrier layer, the copper seed layer is deposited. See 804. Next, the semiconductor wafer is moved to a plating system for subsequent electrofill operations in accordance with the IC manufacturing process being implemented, such as the Damascene processing described in FIG. 1. See 805. A schematic illustration of these two layers is shown in FIG. 8B. The illustration includes the underlying dielectric 851 and the single layer of TiN 853 that makes up the barrier. The CVD deposition as described has been found to work well with IC features about 0.16 to 0.25 μm in size.

PVD Apparatus

Figure 9:
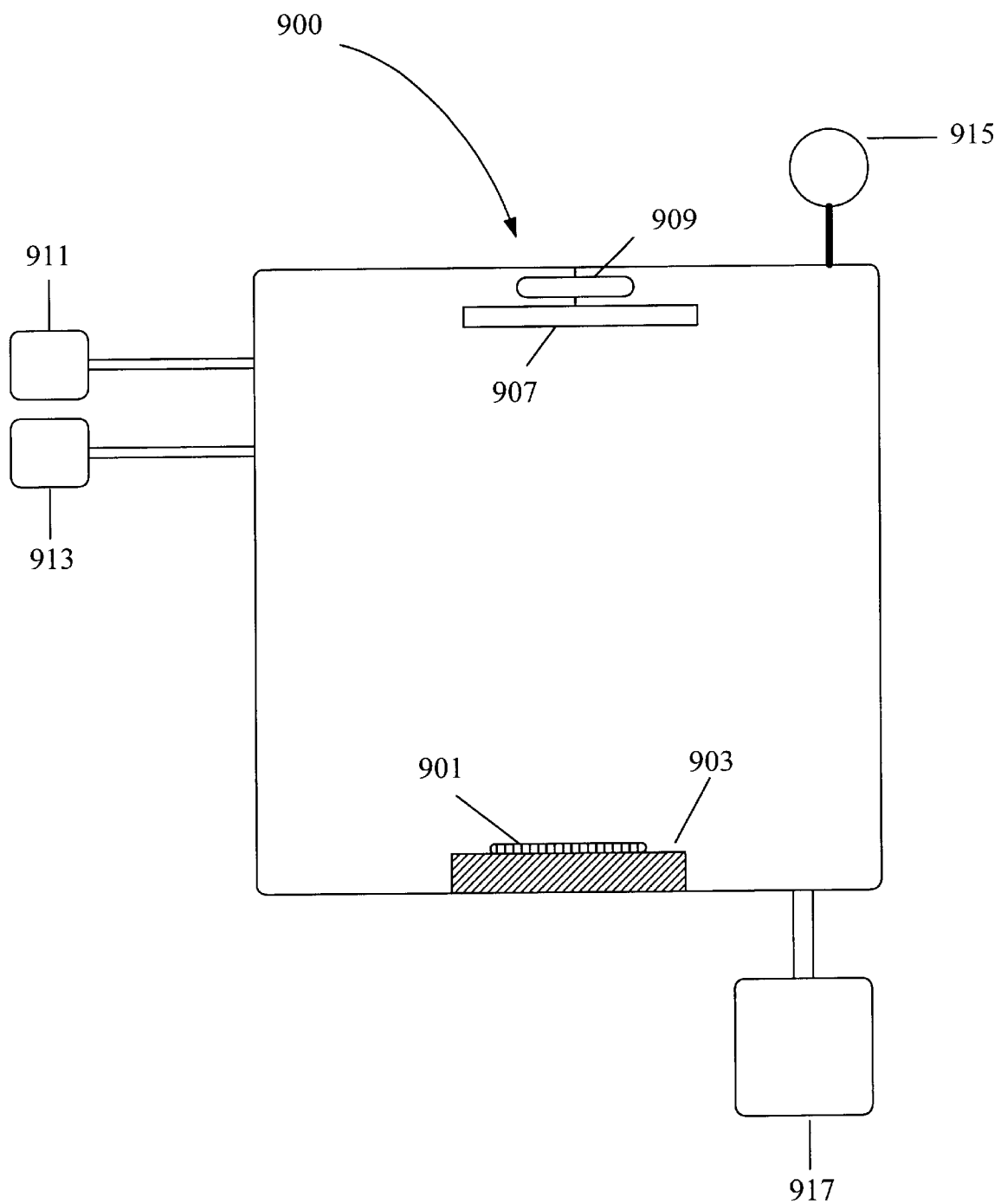
FIG. 9 schematically illustrates a PVD apparatus suitable for practicing the present invention.

FIG. 9 depicts a PVD system 900, in which the invention may be practiced. Inside the apparatus chamber, the semiconductor wafer 901, sits on top of a supporting pedestal 903. The supporting pedestal 903 has a thermocouple or other temperature sensing mechanism attached to it to precisely monitor the temperature of the wafer. The wafer can be cooled by any number of commonly-known methods. In a preferred embodiment, the wafer is placed on a table that is maintained at a cool temperature, and is also exposed on its bottom-side to a cool neutral gas such as Ar at 7 torr.

The apparatus includes a copper target 907 and a magnet for directing the copper ions 909. FIG. 9 shows both an argon source 911 and a passivating agent source 913. If both sources 911 and 913 are being used, they can be introduced through different lines as shown, or through the same line. The flow rate from each of these sources can be controlled separately. controlled If introduced as gas, they must be converted to plasma within system 900. The system also includes a pressure gauge 915 and a pump 917 for controlling the flow of gases.

CVD Apparatus

Figure 10:
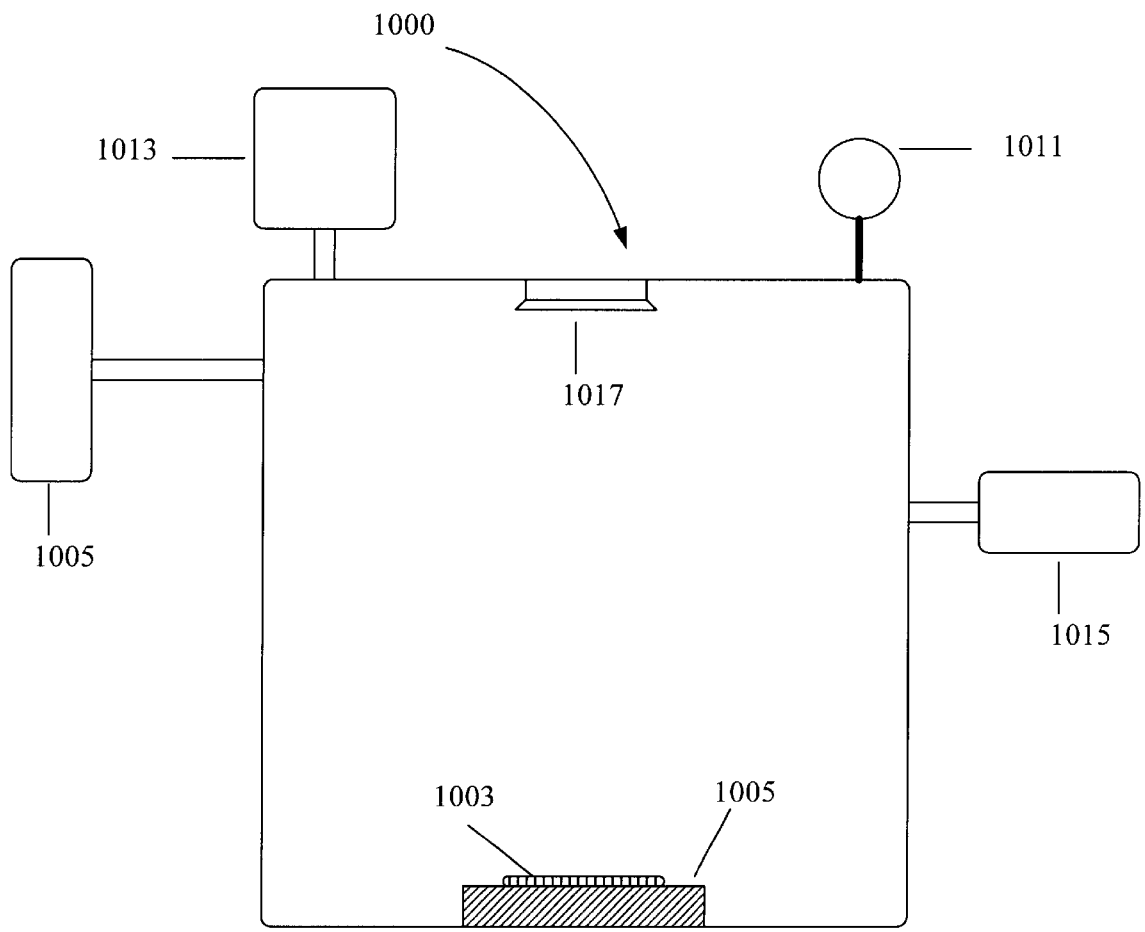
FIG. 10 schematically illustrates a CVD apparatus suitable for practicing the present invention.

FIG. 10 depicts a CVD system 1000, in which the invention may be practiced. Inside the apparatus chamber, the semiconductor wafer 1003, sits on top of a supporting pedestal 1005. The supporting pedestal 1005 has a thermocouple or other temperature sensing mechanism attached to it to precisely monitor the temperature of the wafer. The wafer is typically heated by the pedestal. A titanium precursor source 1009, typically stores the titanium precursor as a liquid. The CVD system also includes a pressure gauge 1011, to monitor the pressure within the chamber, the nitrogen source ($NH_3$) 1013 and a pump 1015. The gases that are to be introduced in the chamber are typically done so through a showerhead 1017.

Although various details have been omitted for clarity's sake, various design alternatives may be implemented. Therefore, the present examples are to be considered as illustrative and not restrictive, and the invention is not to be limited to the details given herein, but may be modified within the scope of the appended claims.

What is claimed is:

1. A method of forming a barrier layer comprising tantalum nitride by physical vapor deposition on a semiconductor substrate, such that the barrier layer reduces agglomeration and notching of a copper seed layer formed on top of the barrier layer, the method comprising:

sputtering a target comprising tantalum; and
introducing a nitrogen source in an amount so that the surface of the barrier layer displays a randomness of at least about 50%.

2. The method of claim 1 wherein the randomness is about 50 to 70%.

3. The method of claim 1 wherein the nitrogen source is $N_2$ gas.

4. The method of claim 1 wherein the nitrogen source is $N_2$ gas and the $N_2$ gas is introduced at a rate of about 10 to 110 SCCM.

5. The method of claim 1 wherein the nitrogen source is $N_2$ gas and the $N_2$ gas is introduced at a rate of about 30 to 40 SCCM.

6. The method of claim 1 wherein the method is carried at about 2 to 8 millitorr.

7. The method of claim 1 wherein the method is carried out at about 20 to 80° C.

8. The method of claim 1 wherein the barrier layer is formed at a rate of about 1 to 15 Å per second.

9. The method of claim 1 wherein the barrier layer is formed at a rate of about 12 Å per second.

10. The method of claim 1 wherein about 25 to 100 Å of barrier layer is formed at the bottom of a feature.

11. The method of claim 1 wherein about 50 Å of barrier layer is formed at the bottom of a feature of the semiconductor substrate.

12. A method of forming a barrier layer comprising tantalum and tantalum nitride, by physical vapor deposition on a semiconductor substrate, such that the barrier layer reduces agglomeration and notching of a copper seed layer formed on top of the barrier layer, the method comprising:
sputtering a target comprising tantalum to deposit tantalum; and
sputtering a target comprising tantalum and introducing a nitrogen source to deposit tantalum nitride at the surface of the barrier layer, the nitrogen source being introduced in an amount so that the surface displays a randomness of at least about 50%.

13. The method of claim 12 wherein the randomness is about 50 to 70%.

14. The method of claim 12 wherein the nitrogen source is $N_2$ gas.

15. The method of claim 12 wherein the nitrogen source is $N_2$ gas and the $N_2$ gas is introduced at a rate of about 10 to 110 SCCM.

16. The method of claim 12 wherein the nitrogen source is $N_2$ gas and the $N_2$ gas is introduced at a rate of about 30 to 40 SCCM.

17. The method of claim 12 wherein the method is carried out at about 2 to 8 millitorr.

18. The method of claim 12 wherein the method is carried out at about 20 to 80° C.

19. The method of claim 12 wherein the barrier layer is formed at a rate of about 1 to 15 Å per second.

20. The method of claim 12 wherein the barrier layer is formed at a rate of about 12 Å per second.

21. The method of claim 12 wherein about 25 to 100 Å of tantalum nitride is formed at the bottom of a feature of the semiconductor substrate.

22. The method of claim 12 wherein about 50 Å of tantalum nitride is formed at the bottom of a feature of the semiconductor substrate.

23. The method of claim 12 wherein about 10 Å of tantalum nitride is formed at the bottom of a feature of the semiconductor substrate.

24. The method of claim 12 wherein about 25 to 150 Å of tantalum is formed at the bottom of a feature of the semiconductor substrate.

25. The method of claim 12 wherein about 100 Å of tantalum is formed at the bottom of a feature of the semiconductor substrate.

26. The method of claim 12 wherein about 50 Å of tantalum is formed at the bottom of a feature of the semiconductor substrate.

27. A method of forming a barrier layer comprising tantalum and tantalum nitride, by physical vapor deposition on a semiconductor substrate, such that the barrier layer reduces agglomeration and notching of a copper seed layer formed on top of the barrier layer, the method comprising:
sputtering a target comprising tantalum and introducing a nitrogen source to deposit tantalum nitride in a bottom layer;
sputtering a target comprising tantalum to deposit tantalum in a middle layer; and
sputtering a target comprising tantalum and introducing a nitrogen source to deposit tantalum nitride in a top layer at the surface of the barrier layer, the nitrogen source being introduced in an amount so that the surface displays a randomness of at least about 50%.

28. The method of claim 27 wherein the randomness is about 50 to 70%.

29. The method of claim 27 wherein the nitrogen source is $N_2$ gas.

30. The method of claim 27 wherein the nitrogen source is $N_2$ gas and the $N_2$ gas is introduced at a rate of about 10 to 110 SCCM.

31. The method of claim 27 wherein the nitrogen source is $N_2$ gas and the $N_2$ gas is introduced at a rate of about 30 to 40 SCCM.

32. The method of claim 27 wherein the method is carried out at about 2 to 8 millitorr.

33. The method of claim 27 wherein the method is carried out at about 20 to 80° C.

34. The method of claim 27 wherein the barrier layer is formed at a rate of about 1 to 15 Å per second.

35. The method of claim 27 wherein the barrier layer is formed at a rate of about 12 Å per second.

36. The method of claim 27 wherein about 25 to 100 Å of tantalum nitride is formed at the bottom of a feature of the semiconductor substrate.

37. The method of claim 27 wherein about 50 Å of tantalum nitride is formed at the bottom of a feature of the semiconductor substrate.

38. The method of claim 27 wherein about 10 Å of tantalum nitride is formed at the bottom of a feature of the semiconductor substrate.

39. The method of claim 27 wherein about 25 to 150 Å of top-layer tantalum is formed at the bottom of a feature of the semiconductor substrate.

40. The method of claim 27 wherein about 100 Å of top-layer tantalum is formed at the bottom of a feature of the semiconductor substrate.

41. The method of claim 27 wherein about 50 Å of top-layer tantalum is formed at the bottom of a feature of the semiconductor substrate.

42. The method of claim 27 wherein about 25 to 150 Å of bottom-layer tantalum is formed at the bottom of a feature of the semiconductor substrate.

43. The method of claim 27 wherein about 100 Å of bottom-layer tantalum is formed at the bottom of a feature of the semiconductor substrate.

44. The method of claim 27 wherein about 50 Å of bottom-layer tantalum is formed at the bottom of a feature of the semiconductor substrate.

45. A method of forming a barrier layer comprising titanium nitride by chemical vapor deposition on a semiconductor substrate, such that the barrier layer reduces agglomeration and notching of a copper seed layer formed on top of the barrier layer, the method comprising:

introducing a titanium-containing precursor and a nitrogen source into a chamber, nitrogen source being introduced in an amount so that the surface displays a randomness of at least about 50%.

46. The method of claim 45 wherein the randomness is about 50 to 100%.

47. The method of claim 45 wherein the titanium-containing precursor is TDEAT.

48. The method of claim 45 wherein and the nitrogen source is $NH_3$.

49. The method of claim 45 wherein the method is carried out at about 25 to 100 torr.

50. The method of claim 45 wherein the method is carried out at about 60 torr.

51. The method of claim 45 wherein the method is carried out at about 200 to 500° C.

52. The method of claim 45 wherein the $NH_3$ flow is about 3 to 8 liters gas per minute.

53. The method of claim 45 wherein the TDEAT flow is about 0.02 to 0.20 mg liquid per minute.

54. The method of claim 45 wherein the $NH_3$ flow is about 6 liters gas per minute.

55. The method of claim 45 wherein the TDEAT flow is about 0.11 milligrams liquid per minute.

56. The method of claim 45 wherein the titanium nitride is formed at a rate of about 1 to 10 Å per second.

57. The method of claim 45 wherein the titanium nitride is formed at a rate of about 4 Å per second.

58. The method of claim 45 wherein about 25 to 100 Å of barrier layer is formed at the bottom of a feature of the semiconductor substrate.

59. The method of claim 45 wherein about 50 Å of barrier layer is formed at the bottom of a feature of the semiconductor substrate.

60. The method of claim 45 wherein about 10 Å of barrier layer is formed at the bottom of a feature of the semiconductor substrate.

61. A method of forming a barrier layer comprising tantalum nitride by physical vapor deposition on a semiconductor substrate, such that the barrier layer reduces agglomeration and notching of a copper seed layer formed on top of the barrier layer, the method comprising:

sputtering a target comprising tantalum; and introducing a nitrogen source in an amount so that the surface of the barrier layer displays a randomness of at least about 50%, wherein the method is carried at about 2 to 8 millitorr.

62. A method of forming a barrier layer comprising tantalum and tantalum nitride, by physical vapor deposition on a semiconductor substrate, such that the barrier layer reduces agglomeration and notching of a copper seed layer formed on top of the barrier layer, the method comprising:

sputtering a target comprising tantalum to deposit tantalum; and sputtering a target comprising tantalum and introducing a nitrogen source to deposit tantalum nitride at the surface of the barrier layer, the nitrogen source being introduced in an amount so that the surface displays a randomness of at least about 50%, wherein the method is carried out at about 2 to 8 millitorr.

63. A method of forming a barrier layer comprising titanium nitride by chemical vapor deposition on a semiconductor substrate, such that the barrier layer reduces agglomeration and notching of a copper seed layer formed on top of the barrier layer, the method comprising:

introducing a titanium-containing precursor and a nitrogen source into a chamber, nitrogen source being introduced in an amount so that the surface displays a randomness of at least about 50%, wherein between about 10 to 100 Å of barrier layer is formed at the bottom of a feature of the semiconductor substrate.

* * * * *